United States Patent
Lee et al.

(10) Patent No.: US 6,282,137 B1
(45) Date of Patent: Aug. 28, 2001

(54) SRAM METHOD AND APPARATUS

(75) Inventors: Hyun Lee, Allentown; Michael J. Hunter, Mertztown, both of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/395,835

(22) Filed: Sep. 14, 1999

(51) Int. Cl.⁷ .................................................. G11C 7/02
(52) U.S. Cl. .................... 365/207; 365/205; 365/185.25; 365/189.01
(58) Field of Search .................. 365/207, 205, 365/189.01, 185.25

(56) References Cited

U.S. PATENT DOCUMENTS

| | | | | |
|---|---|---|---|---|
| 5,526,314 | * | 6/1996 | Kumar | 365/207 |
| 5,687,127 | * | 11/1997 | Takahashi | 365/205 |
| 5,912,853 | * | 6/1999 | Rao | 365/205 |
| 5,936,905 | * | 8/1999 | Proebsting | 365/208 |
| 5,982,690 | * | 11/1999 | Austin | 365/205 |
| 6,031,775 | * | 2/2000 | Chang et al. | 365/205 |
| 6,064,613 | * | 5/2000 | Wang | 365/207 |

* cited by examiner

Primary Examiner—Richard Elms
Assistant Examiner—Tuan T. Nguyen
(74) Attorney, Agent, or Firm—Synnestvedt & Lechner LLP

(57) ABSTRACT

The invention is a method and apparatus for minimizing voltage swing on the BIT and $\overline{\text{BIT}}$ lines of a static random access memory (SRAM), thus minimizing precharge time and READ time for the SRAM. In accordance with the invention, an enhanced sense amplifier is provided in the last column of the memory array. The enhanced sense amplifier detects when the differential voltage between the BIT and $\overline{\text{BIT}}$ lines exceeds the minimum detectable threshold of the sense amplifier. In response to that event, it asserts a feedback line to the READ control circuitry which halts the read operation essentially as soon as the differential voltage between the BIT and $\overline{\text{BIT}}$ lines reaches the minimum differential voltage detectable by the sense amplifier. The technique is adaptive and assures both accurate operation and minimal precharge and read access times across variations in temperature and other environmental conditions.

28 Claims, 4 Drawing Sheets

SRAM METHOD AND APPARATUS

FIELD OF THE INVENTION

The invention pertains to static random access memories (SRAMs).

BACKGROUND OF THE INVENTION

SRAMs are read/write memories capable of holding data without the need for frequent refreshing of the contents of the memory cells in the SRAM. In a conventional SRAM, the memory cells are arranged in a series of rows and columns. Referring to FIG. 1, which shows the basic structure of the memory array of a conventional SRAM 10, in each column 12, all the memory cells 14 are coupled between a BIT line 16 and a $\overline{\text{BIT}}$ line 18. FIG. 1 shows only one column, that column comprising two column segments 12a and 12b that are alternately selectable via a column select signal 20 that is decoded from the address. However, it should be understood that a typical SRAM comprises many columns. Further, the purpose of segmenting the columns in the manner shown is related to implementation details and particularly to reducing the physical length of the columns relative to the physical width of the memory array. Thus, it should further be apparent to those of skill in the related arts that many SRAMs have simple rows and columns without segmentation.

Each column segment comprises N rows 22 of which only the first row (row 0) and the last row (row N-1) are shown. Each row is coupled to a word select line 24 (sometimes called a row select line) RL(0) through RL(N-1). The signals on the row select lines 24 are decoded from the address to select a particular row in the memory array. A particular column containing the memory cell being accessed also is decoded from the address to select the single memory cell for reading via a plurality of column select lines, such as column select line 20.

The BIT lines 16 of each column segment of a single column are coupled together and placed at one input of a sense amplifier 26. The $\overline{\text{BIT}}$ lines 18 of each column segment of a column are coupled together and placed at the second input of the sense amplifier 26. Each column in a multi-column memory has its own sense amplifier. The sense amplifier 26 is controlled by a READ control line. Specifically, the sense amplifier output is latched when the READ line goes unasserted.

In a segmented column memory array as illustrated in FIG. 1, transistor switch 28a is interposed between each BIT line 16 and the first input of the sense amplifier and another transistor switch 28b is interposed between each $\overline{\text{BIT}}$ line 18 and the corresponding input of the sense amplifier for selecting the one of the two column segments containing the cell which is being accessed by the address. The switches 28a and 28b are coupled to react complementarily to the same column select signal lines, i.e., CSEL-A 20 and its compliment $\overline{\text{CSEL-A}}$. The column select signal essentially is another portion of the decoded address.

Each column segment further comprises a precharge circuit 34 for precharging both the BIT and $\overline{\text{BIT}}$ lines 16 and 18 of the column segments 12a and 12b to the same predetermined voltage before a read operation. Particularly, the individual memory cells 14 are coupled between the BIT and $\overline{\text{BIT}}$ lines of the corresponding column segment such that, during a READ, the cell selected by the decoded address, i.e., the row select line signals 22 and column segment select signals 30 will discharge one and only one of the BIT and $\overline{\text{BIT}}$ lines depending on whether it is storing a 0 or a 1. The BIT line represents the true value of the stored BIT, while the $\overline{\text{BIT}}$ line is its complement. All control signals, including the decoded address signals, such as row select and column select, the precharge signal, and the READ signal are shown emanating from a control circuit 37.

When a cell 14 is read, the sense amplifier 26 detects the differential between the relevant BIT and $\overline{\text{BIT}}$ line pairs 16 and 18, latches those values (at the time that the READ line goes unasserted) and amplifies and outputs the corresponding bit value.

The purpose of precharging the BIT and $\overline{\text{BIT}}$ lines is to reduce the time necessary to read a cell. In particular, it takes substantially more time for a cell to charge a line than it does to discharge it. Accordingly, prior to a READ, both lines are charged by the precharge circuit and the READ operation comprises discharging one of the BIT and $\overline{\text{BIT}}$ lines.

With the ever present desire to increase memory capacity and speed, many SRAMs currently utilize additional techniques to further decrease READ times. In particular, one class of techniques revolves around the concept of completing the READ before the BIT or $\overline{\text{BIT}}$ line is completely discharged. In particular, the sense amplifiers typically used in SRAMs require a relatively small voltage differential between their inputs to switch (or, more accurately, to detect the differential between the BIT and $\overline{\text{BIT}}$ lines coupled at their inputs). For instance, a typical detectable differential voltage threshold across the inputs of a sense amplifier might be about 400 millivolts.

Within this class, there are at least three techniques that are in common use for cutting short the discharge time involved with the READ operation. They are (1) bit line clamping, (2) controlling the on time of the cell access transistors with a delay circuit and (3) controlling the on time of the cell access transistors using a dummy column as a reference. Each of these techniques will be briefly described below. However, those of skill in the art of SRAM design will already be familiar with each of these techniques.

Bit clamping is a technique by which the BIT and $\overline{\text{BIT}}$ lines are precharged to some voltage less than the VDD (or VSS) voltage. The theory behind bit line clamping is to precharge the BIT and $\overline{\text{BIT}}$ lines to a voltage only slightly above the necessary threshold voltage for detecting a differential across the sense amplifier. For instance, in a 3 volt circuit (VDD=3 volts and VSS=0 volts,) let us assume that the switch point between a logic high value and a logic low value is 1.5V. Accordingly, with BIT clamping, the BIT and $\overline{\text{BIT}}$ lines may be precharged to only about 1.8 volts rather than 3 volts. Accordingly, the discharged line (BIT or $\overline{\text{BIT}}$) can reach the threshold value much more quickly than if it had been precharged to 3 volts.

FIG. 2 is a circuit diagram of an exemplary precharge circuit employing bit line clamping. As previously noted, the precharge circuit 202 is coupled between the BIT line 204 and the $\overline{\text{BIT}}$ line 206 of the corresponding column (or column segment). The precharge circuit is of a form conventional in the art and comprises three NMOS transistors 208, 210 and 212. Normally, the junction 214 between the transistors 210 and 212 would be coupled directly to the VDD voltage rail. However, with bit line clamping, a diode-coupled PMOS transistor 216 is coupled between VDD and junction 214. This lowers the voltage to which the precharge circuit will precharge the BIT and $\overline{\text{BIT}}$ lines 204 and 206 by the threshold voltage of the PMOS transistor 216. A typical threshold voltage for a PMOS transistor might be 0.6V. Accordingly, in this circuit implementation, the precharge voltage is 2.4 volts rather than 3 volts. If it was desired to drop the precharge voltage from a VDD of 3 volts to, for example, 1.8 volts as discussed previously, there would simply be two BIT line clamping diode coupled transistors coupled in series between VDD and node 214.

FIG. 3 illustrates an exemplary embodiment of the second aforementioned technique, i.e., controlling the on time of the cell access transistors with a delay. The theory behind this technique is to stop the READ operation and latch the sense amplifier after a sufficient time elapses to assure that the voltage differential across the sense amplifier inputs exceeds the minimum necessary threshold, but before the BIT or $\overline{\text{BIT}}$ line discharges completely. To implement this concept, the READ control line 302 (and possibly other of the control lines such as the row select line 306 and column select line 308) are not only fed directly from the control circuit 305 to their normal destinations within the memory array 303, but also fed through a delay circuit 304. The delay circuit typically may comprise a chain of inverters (or inverter equivalents). When the values of these signals change, the outputs of the delay circuit will not match the true value of those signals for the delay period of the delay circuit 304. After the delay period established by the delay circuit, the undelayed signals and the corresponding delayed signals will match again. When they match again, the READ is considered completed and the sense amplifiers are latched. The delay period is predetermined during the design of the circuit and is selected to be at least as long as the longest possible period needed to read a cell in the SRAM. Even the longest possible READ time for the memory is usually significantly shorter than the time required to completely discharge the BIT or $\overline{\text{BIT}}$ line.

FIG. 4 illustrates the third above mentioned technique for minimizing read discharge and precharge times. In this technique, a dummy column 402-N is added to the end of the memory array (the term end signifies the longest distance in terms of signal propagation delay from the source of the control lines (e.g., read, row select and column select) to the column. All of the memory cells in the dummy column 402 are written with the same data (0 or 1). Preferably, if the idle mode of the sense amplifier 406 is logic 1 during the write or precharge cycle, the dummy cells are written with logic 0 and vice versa. The dummy column 402 has its own sense amplifier 406-N. Thus, whenever a READ operation is executed, the output of the sense amplifier 406-N always makes a high to low transition. The output of the sense amplifier 406-N of the dummy column is forwarded to the control circuit 408 where it is detected. Upon detection, the READ operation is ceased, i.e., the sense amplifier is latched by deasserting the READ control line 410. As noted above, the dummy column is placed at the end of the memory array so that the read access delay set by the dummy column is greater than the read access delay of any other column. This guarantees that, when the READ operation is halted, the sense amplifier corresponding to the actual cell being read has switched.

All the aforementioned techniques for minimizing read time have certain disadvantages. For instance, the bit line clamping technique becomes less feasible in connection with low voltage (less than 1.5V) designs because this technique reduces the bit line operational voltage by the threshold voltage of the bit line clamping transistor or transistors. Depending on the particular design of the sense amplifier used in the SRAM, there are different problems. For instance, if there is a clamping diode connected to the sense amplifier in series with the power supply VDD/VSS, the output voltage of the sense amplifier will be VDD−$V_T$ (where $V_T$ represents the threshold voltage of the BIT line clamping transistor). This voltage level could cause DC power to dissipate during a read operation, and drive the next gate with an intermediate voltage.

In a case where there is no clamping diode connected to the sense amplifier in series with the power supply, there is no danger of the sense amplifier driving the next gate with an intermediate voltage as in the previous case. However, the precharge voltage level of the BIT and $\overline{\text{BIT}}$ lines are $V_T$ below the precharge level of the inputs to the sense amplifiers (assuming a single PMOS diode transistor used as the BIT line clamp). Thus, as the BIT line access transistors turn $\overline{\text{BIT}}$ on, an instantaneous charge sharing would occur between input nodes of the sense amplifier and the BIT and $\overline{\text{BIT}}$ lines. Accordingly, the inputs to the sense amplifier start to move towards VDD−$V_T$. Therefore, if there are mismatches in (parasitic) capacitance lines among the BIT lines and among the sense amplifier inputs, the sense amplifier might swing in the wrong direction. Once the inputs to the sense amplifier swing toward the wrong direction, the sense amplifier (which usually comprises a cross coupled circuit design) will make a wrong decision and will push the BIT line further in the wrong direction. If the transconductance of the load transistors in the sense amplifier is higher than that of the load transistors in the memory cells, the memory cell data could be overwritten with wrong data. Thus, while performing a read operation, it could overwrite the cell data and produce a wrong value at the output of the sense amplifier.

In connection with the second technique, i.e., controlling the on time of the read operation with a delay circuit, the delay circuit needs to be individually designed for each operating condition and for each specific memory size. Accordingly, the circuit is not transferable from one design to the another and must be redesigned for each different SRAM to which the technique is applied. Furthermore, if the operation environment conditions change due to a voltage or temperature drift such that the read access time becomes longer than the delay time, the SRAM will cease to function at all.

Finally, the third technique, i.e., using a dummy column, also has shortcomings. First, it requires extra die area to implement. Secondly, it dissipates extra power to precharge and discharge the BIT and $\overline{\text{BIT}}$ lines in the dummy column. Thirdly, it adds extra delay on the row select lines to drive the cells of the dummy column (which comprise an extra column at the end of the real columns).

SUMMARY OF THE INVENTION

A method and apparatus is provided in accordance with the invention for minimizing voltage swing on the BIT and $\overline{\text{BIT}}$ lines in a SRAM. In accordance with the present invention, a column in an SRAM memory array (or memory group within an array) is provided with a sense amplifier that produces a feedback signal indicative of when the voltage differential across the inputs of that sense amplifier has exceeded the minimum threshold for switching of that sense amplifier. The feedback signal from the sense amplifier is used by the read control circuitry to terminate the read when the feedback signal goes asserted, thus halting the read operation as soon as the data at the output of the sense amplifier is valid, which typically is before the BIT or $\overline{\text{BIT}}$ line is completely discharged.

DETAILED DESCRIPTION OF THE INVENTION

Figure 1:
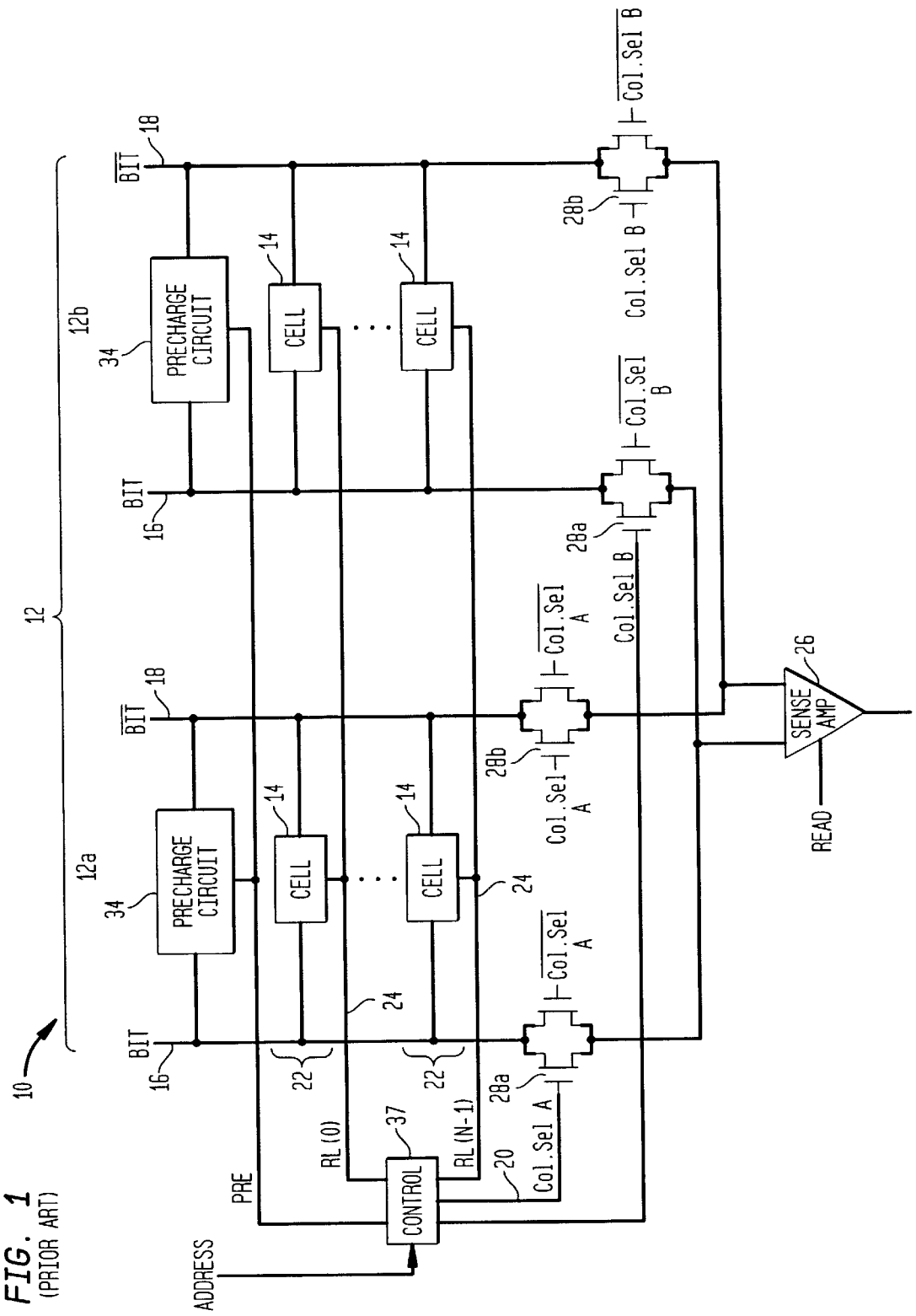
FIG. 1 is a schematic diagram of a conventional SRAM memory array.
Figure 2:
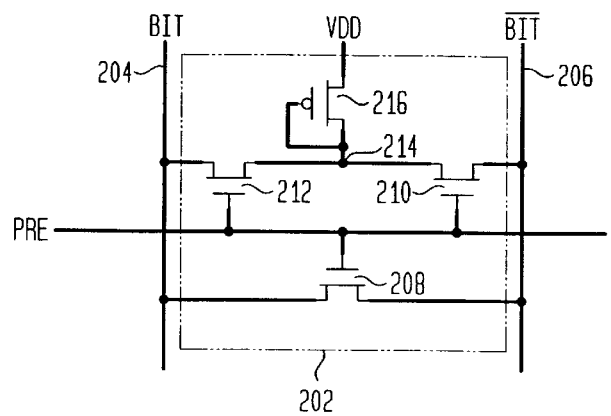
FIG. 2 is a circuit diagram of a precharge circuit employing a BIT line clamping method for minimizing precharge voltage swing during READ operations in accordance with the prior art.
Figure 3:
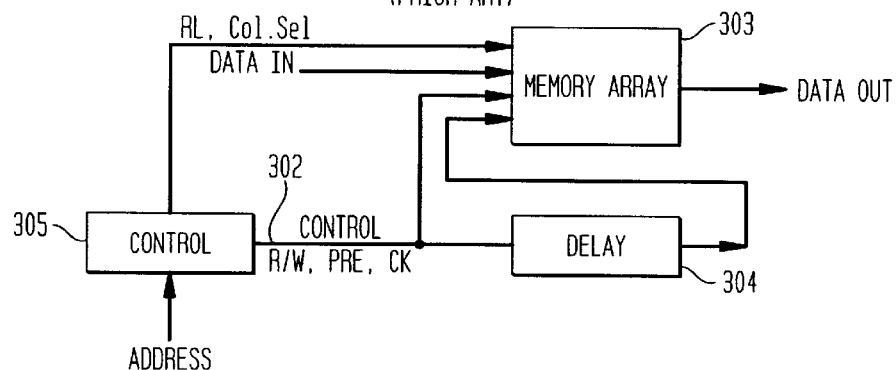
FIG. 3 is a block diagram illustrating an SRAM memory employing a delay circuit method for minimizing precharge voltage swing during READ operations in accordance with the prior art.
Figure 4:
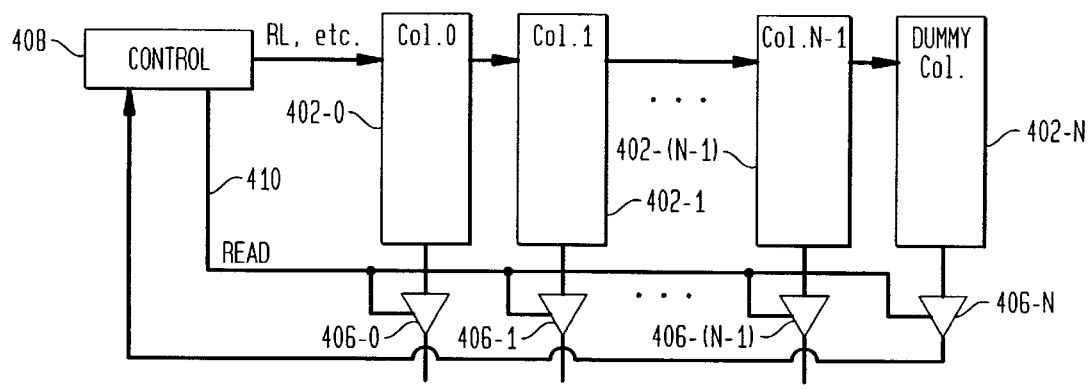
FIG. 4 is a block diagram of an SRAM employing a dummy column method for minimizing precharge voltage swing during READ operations accordance with the prior art.
Figure 5:
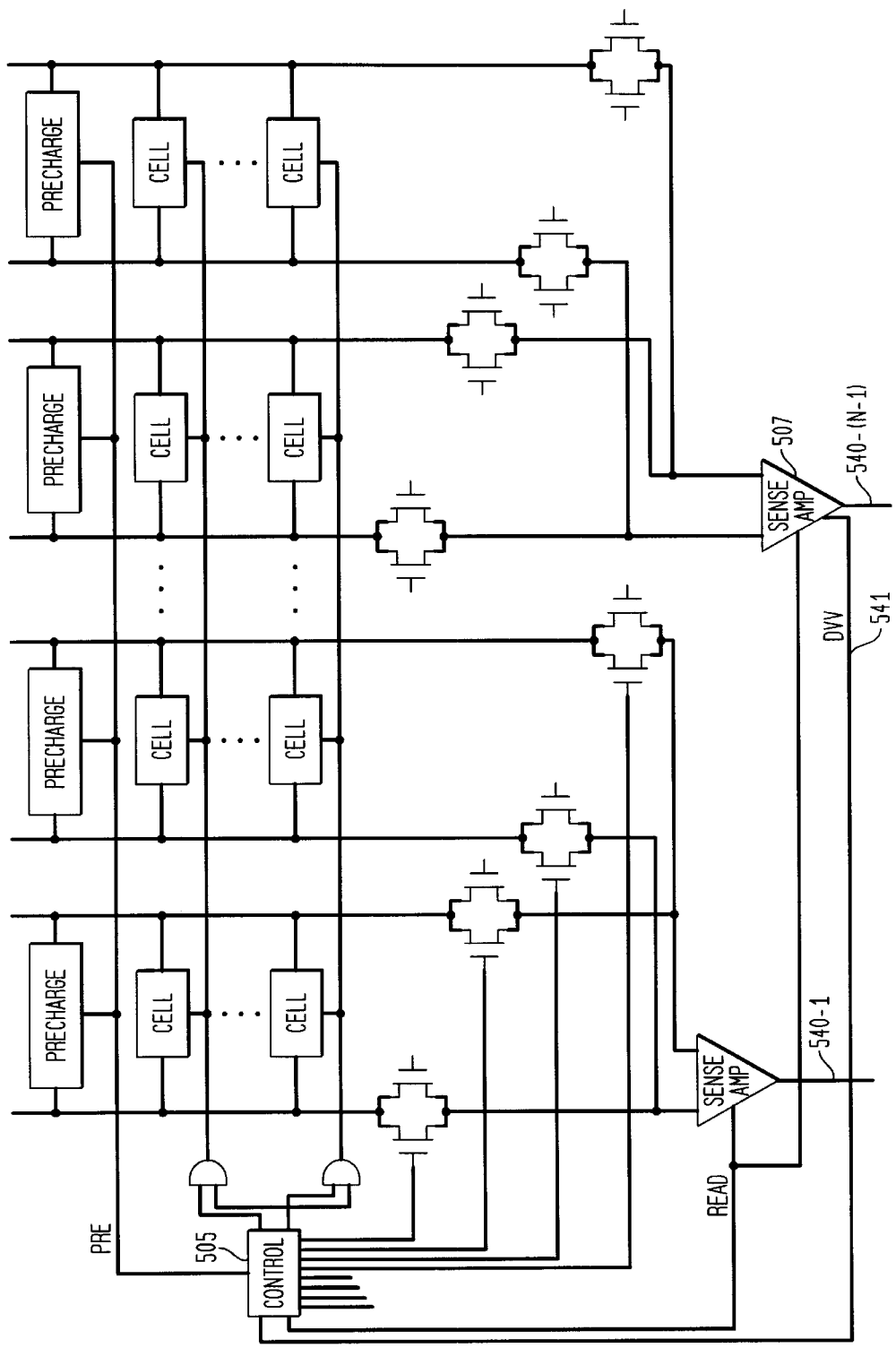
FIG. 5 is a schematic diagram illustrating an SRAM memory array in accordance with the present invention.

FIG. 5 is a schematic diagram of an SRAM memory array in accordance with the present invention. The majority of the memory array may be essentially conventional. For example, it may be identical to the memory array illustrated by FIG. 1 except for one of the sense amplifiers, which is enhanced relative to the other sense amplifiers in the circuit in order to provide a feedback signal DVV to the control circuit 505, and additional circuitry within control circuit 505 for processing the feedback signal as described below. In a preferred embodiment, the enhanced sense amplifier 507 of the end column, i.e., the column furthest away in terms of propagation delay from the READ control circuitry 505 is the enhanced sense amplifier. As can be seen from the figure, this sense amplifier, in addition to generating a bit output signal 540-N, also generates a feedback signal 541 termed the differential voltage value or DVV signal. The DVV signal is fed back to the control circuitry 505 which is designed to halt the READ operation when DVV is asserted.

The enhanced sense amplifier 507 is designed to (1) assert DVV only when the READ control line is asserted and (2) the voltage differential between the BIT and $\overline{\text{BIT}}$ lines of the column being read exceeds the minimum threshold differential that the sense amplifier can detect.

Figure 6:
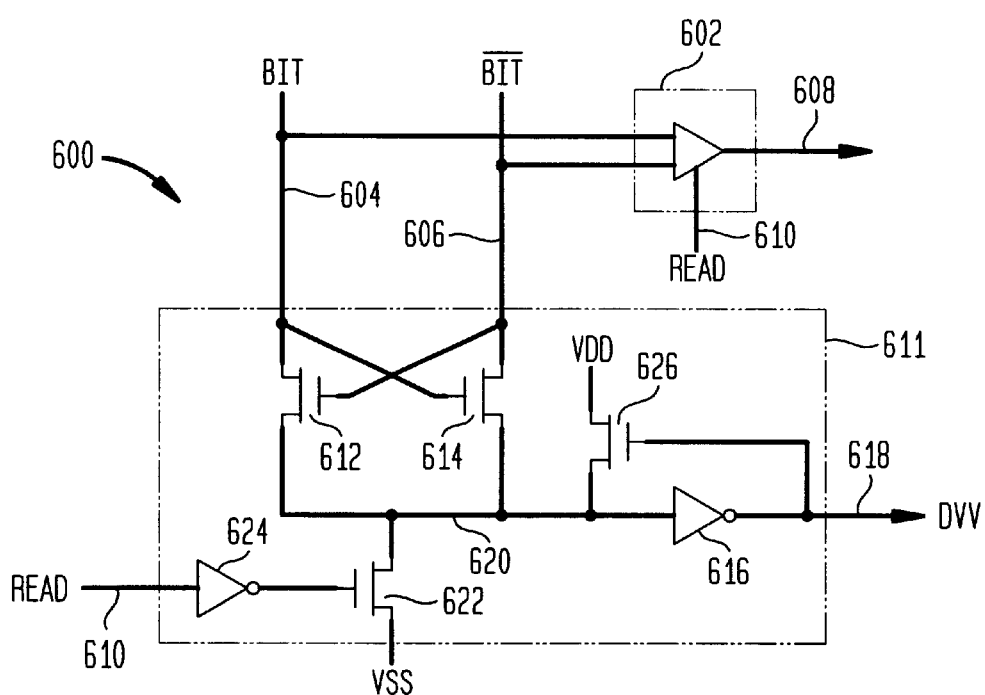
FIG. 6 is a circuit diagram of the enhanced sense amplifier of FIG. 5 in accordance with a preferred embodiment of the present invention.

FIG. 6 is a circuit diagram illustrating the enhanced sense amplifier 600 in accordance with a preferred embodiment of the invention. The main sense amplifier portion 602 of the circuit 600 may be conventional. The inverting input to the sense amplifier 602 is coupled to one of the BIT and $\overline{\text{BIT}}$ lines. In this example, it is the $\overline{\text{BIT}}$ line 606. However, it could just as readily have been the BIT line 604. The noninverting input is coupled to the other of the two lines, e.g., the BIT line 604. The output terminal 608 is the output bit value of the accessed memory cell. The sense amplifier 602 is unlatched for reading in response to assertion of the READ control signal line 610.

The enhanced sense amplifier 600 further comprises circuit 611 having transistors 612 and 614. The source terminals of transistors 612 and 614 are coupled to the BIT and $\overline{\text{BIT}}$ lines 604 and 606, respectively. The drain terminals of transistor 612 and 614 are coupled together to node 620 which also is the input of an inverter 616. The output of the inverter 616 is the DVV feedback signal line 618. Node 620 is further coupled to the drain terminal of another transistor 622. The source terminal of transistor 622 is coupled to the VSS rail. The gate terminal of transistor 622 is coupled through another inverter 624 to the READ control signal line 610. The gate of transistor 612 (whose current flow terminals are coupled in the BIT line 604), is coupled to the $\overline{\text{BIT}}$ line 606. The control terminal of transistor 614 (whose current flow terminals are coupled in the $\overline{\text{BIT}}$ line) is coupled to the BIT line 604. The circuit 611 further comprises transistor 626. The current flow terminals of transistor 626 are coupled between VDD and node 620. The gate terminal of transistor 624 is coupled to the output of inverter 612, i.e., DVV.

In this particular embodiment, we assume READ is asserted high and DW is asserted (i.e., the sense amplifier is latched, thus halting the READ operation) low. It will be clear to those skilled in the relevant art that the circuit can be readily modified to accommodate different assertion levels for all signals.

The circuit operates as follows. When the READ control line 610 is unasserted, i.e., low, transistor 622 is turned on, thus driving node 620 to ground (logic low). The low voltage at node 620 is inverted by inverter 616 so that the DVV feedback signal is high (i.e., unasserted).

When the READ control line 610 is asserted (high) to commence a read operation of an addressed memory cell by unlatching the sense amplifier, transistor 622 is turned off. Thus, node 620 can now be responsive to the values on the BIT and $\overline{\text{BIT}}$ lines 604 and 606. During the READ, one or the other of the BIT and $\overline{\text{BIT}}$ lines will start discharging depending on the value stored in the addressed memory cell in accordance with the conventional operation of an SRAM. When the voltage on the discharging line 604 or 606 reaches a value equal to the precharge voltage minus the threshold voltage of transistors 612 and 614, the one of transistors 612 and 614 that has its gate coupled to the discharging line will be turned on. Particularly, if the voltage on the BIT line is discharged, transistor 614 will be turned on. Alternately, when the voltage on the $\overline{\text{BIT}}$ line is discharged, transistor 612 will be turned on. When either one of these transistors is turned on, the full precharge voltage existing on the other one of the BIT and $\overline{\text{BIT}}$ lines will pass through the turned on transistor 612 or 614 to node 620. Accordingly, the output 618 of inverter 616 will switch to low, i.e., DVV will be asserted. Responsive to the assertion of DVV, control circuit 505 halts the READ operation by deasserting at least the READ control line 610.

Transistor 626 is optional. In a preferred embodiment, it forms part of an internal feedback loop around inverter 622 that helps maintain node 620 at a logic high level until the READ control line 610 goes unasserted again. Specifically, transistor 626 is off while READ is unasserted and when READ is initially asserted. However, when BIT or $\overline{\text{BIT}}$ (and thus node 620) discharges to the switching point of inverter 622, DVV line 618 goes high, thus turning on transistor 626. With transistor 626 now on, it helps pull node 620 up to VDD even faster.

The present invention provides the following advantages over conventional designs. First, it is a fail-safe design. That is, the feedback design of the present invention guarantees correct operation of the SRAM regardless of variations in operating conditions and processing. In the prior art delay circuit technique, for instance, the READ control line is electrically independent from the circuit delay path such that the turn on time of the memory cell is independent from the READ access time. Thus, through environmental changes that affect different portions of the circuit in different ways, it is possible for the delay through the delay circuit to become shorter than the READ access time. This would cause the READ operation to be halted before the BIT and BIT lines develop an adequate differential voltage to be sensed properly by the sense amplifier. This would cause the memory READ operation to fail.

Another advantage of the invention is that it works at low voltages. Unlike the bit line clamping technique, the present invention does not impose an artificial voltage swing range on the BIT and $\overline{\text{BIT}}$ lines.

Also, whereas the bit line clamping technique causes excessive drift of the sense amplifier switching point and produces a wide variation in READ access times responsive to small variation of the supply voltage during low voltage operation, the present invention suffers from none of those disadvantages.

Even further, unlike the dummy column technique, the present invention adds almost no area overhead to the circuit, nor does it add any significant power dissipation. The present invention adds only approximately four transistors and two inverters to the entire memory array. Accordingly, it also dissipates less power than the dummy column technique.

Even further, the delay circuit technique provides a constant READ access period which is designed so that it will always be greater than the actual time needed to develop an adequate differential voltage across the sense amplifier under the worst case conditions. In the present invention, the READ access time varies to track the minimum amount of time necessary to develop an adequate differential voltage across the BIT and $\overline{\text{BIT}}$ lines.

In fact, READ access time is also minimized relative to the dummy column technique due to the decrease in row select line capacitance due to the smaller number of rows.

Even further, the design in accordance with the present invention can be transported to a wide variety of SRAMS essentially without modification. Also, because it employs a feedback control scheme, it automatically adjusts itself according to given operation environment conditions, e.g., operating voltages and temperatures, to maintain minimal read times.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. An integrated circuit having static random access memory comprising:
   a plurality of memory cells arranged in a plurality of columns and a plurality of rows, each column comprising a BIT line and a $\overline{\text{BIT}}$ line coupled across the memory cells in the column;
   a sense amplifier corresponding to each column, each sense amplifier having first and second inputs and sensing a voltage differential across its first and second inputs to develop an output value;
   one of said sense amplifiers having a detection circuit for detecting when said voltage differential across its first and second inputs exceeds a minimum level for switching said one of said sense amplifiers; and
   said memory adapted to terminate a read operation when said detection circuit detects said minimum level.

2. The integrated circuit of claim 1 wherein said detection circuit is coupled to detect a voltage discharge on either of said BIT and $\overline{\text{BIT}}$ lines and to assert a control signal for terminating said read operation when a voltage differential between said BIT or $\overline{\text{BIT}}$ lines exceeds said minimum level.

3. The integrated circuit of claim 2 wherein said sense amplifiers are latched responsive to assertion of said control signal.

4. The integrated circuit of claim 3 wherein said detection circuit is adapted to respond to said voltage differential only when a read operation is in progress.

5. The integrated circuit of claim 4 further comprising a READ control signal indicative of when the memory is in READ mode and wherein said control signal is held unasserted unless said READ control signal is asserted.

6. The integrated circuit of claim 2 wherein said one of said sense amplifiers is said sense amplifier corresponding to an end one of said columns.

7. The integrated circuit of claim 2 wherein said detection circuit comprises a first transistor having a first current flow terminal coupled to said BIT line, a second current flow terminal coupled to a junction and a control terminal coupled to said $\overline{\text{BIT}}$ line, a second transistor having a first current flow terminal coupled to said $\overline{\text{BIT}}$ line, a second current flow terminal coupled to said junction and a control terminal coupled to said BIT line, and wherein said control signal is a function of a voltage at said junction.

8. The integrated circuit of claim 7 further comprising an inverter having an input coupled to said junction and an output, said output comprising said control signal.

9. The integrated circuit of claim 8 further comprising a READ control signal indicative of when the memory is in READ mode and a third transistor having a first current flow terminal coupled to said junction, a second current flow terminal coupled to a reference voltage and a control terminal coupled to said READ control signal wherein, when said READ control signal is unasserted, said junction is held in a first state corresponding to said control signal being in an unasserted state by said third transistor and when said READ control signal is asserted, said junction is responsive to a voltage on said BIT and $\overline{\text{BIT}}$ lines.

10. The integrated circuit of claim 9 further comprising a fourth transistor having a first current flow terminal coupled to a second reference voltage, a second current flow terminal coupled to said junction and a control terminal coupled to said control signal, said fourth transistor adapted to turn on when said control signal is asserted.

11. The integrated circuit of claim 10 further comprising a second inverter coupled between said READ control signal and said first transistor.

12. The integrated circuit of claim 11 wherein said first through fourth transistors are MOS transistors.

13. A sense amplifier circuit for a column of a static random access memory comprising:
    a sense amplifier having first and second inputs for sensing a voltage differential across its first and second inputs;
    a detection circuit for detecting when said voltage differential across said first and second inputs of said sense amplifier exceeds a minimum level for switching said sense amplifiers, said detection circuit having an output that changes states when a voltage differential across said first and second inputs of said sense amplifier is great enough for said sense amplifier to switch.

14. The circuit of claim 13 wherein said detection circuit further comprises a READ control terminal for accepting a READ control signal and wherein said detection circuit is adapted to respond to said voltage differential only when said READ control signal is asserted.

15. The circuit of claim 14 wherein said output of said detection circuit is held unasserted unless said signal at said READ control terminal is asserted.

16. The circuit of claim 14 wherein said detection circuit comprises a first transistor having a first current flow terminal for coupling to a BIT line of a column of a static random access memory, a second current flow terminal coupled to a junction and a control terminal for coupling to a $\overline{\text{BIT}}$ line of said column of a static random access memory, a second transistor having a first current flow terminal for coupling to said $\overline{\text{BIT}}$ line of said column of said static random access memory, a second current flow terminal coupled to said junction and a control terminal for coupling to said BIT line of said static random access memory, and wherein said output of said detection circuit is a function of a voltage at said junction.

17. The circuit of claim 16 wherein said detection circuit further comprises an inverter having an input coupled to said junction and an output, said output of said inverter comprising said control signal.

18. The circuit of claim 17 further comprising a third transistor having a first current flow terminal coupled to said junction, a second current flow terminal for coupling to a reference voltage and a control terminal coupled to said READ control terminal wherein, when said signal at said READ control terminal is unasserted, said junction is held in a first state and, when said signal at said READ control terminal is asserted, said junction is responsive to said voltage differential.

19. The circuit of claim 18 further comprising a fourth transistor having a first current flow terminal for coupling to a second reference voltage, a second current flow terminal coupled to said junction and a control terminal coupled to said control signal, said fourth transistor adapted to turn on when said control signal is asserted.

20. The circuit of claim 19 further comprising a second inverter coupled between said READ control terminal and said first transistor.

21. The circuit of claim 20 wherein said first through fourth transistors are MOS transistors.

22. A method for limiting voltage swing on BIT and $\overline{\text{BIT}}$ lines of a static random access memory comprising a plurality of memory cells arranged in a plurality of columns and a plurality of rows, each column comprising a BIT line and a $\overline{\text{BIT}}$ line coupled across the memory cells in the column and a sense amplifier having first and second inputs coupled to said BIT and $\overline{\text{BIT}}$ lines, respectively, for sensing a voltage differential across said BIT and $\overline{\text{BIT}}$ lines, said method comprising the steps of:

sensing when said voltage differential across said first and second inputs of one of said sense amplifiers exceeds a minimum level for switching said one of said sense amplifiers; and terminating a read operation when said minimum level is detected.

23. The method of claim 22 wherein;

said sensing step comprises detecting a voltage discharge on either of said BIT and $\overline{\text{BIT}}$ lines; and asserting a feedback signal for terminating said read operation when a voltage differential between said BIT and $\overline{\text{BIT}}$ lines exceeds said minimum level.

24. The method of claim 23 further comprising the step of:

responding to said voltage differential only when said read operation is in progress.

25. The method of claim 22 wherein said sensing step comprises sensing in said sense amplifier corresponding to a last one of said columns.

26. The method of claim 22 wherein said sensing step comprises:

sensing when a voltage on either of said BIT or $\overline{\text{BIT}}$ lines is discharging;

conducting a current from said other of said BIT and $\overline{\text{BIT}}$ lines to a junction responsive to said discharging line; and detecting when voltage at said junction indicates that said current is being conducted.

27. The method of claim 24 wherein said terminating step comprises latching said sense amplifiers responsive to said voltage at said junction indicating that said current is being conducted.

28. The method of claim 27 further comprising; detecting when said memory is in a read mode; and responsive to said memory being in said read mode, holding said junction in a first state corresponding to said feedback signal being in an unasserted state.

* * * * *